US012588240B2

(12) United States Patent
Tsai et al.

(10) Patent No.: US 12,588,240 B2
(45) Date of Patent: Mar. 24, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yuning Tsai, Yokohama Kanagawa (JP); Yoshiko Takahashi, Yokohama Kanagawa (JP); Daisuke Inoue, Fujisawa Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 588 days.

(21) Appl. No.: 18/180,486

(22) Filed: Mar. 8, 2023

(65) Prior Publication Data

US 2024/0105831 A1     Mar. 28, 2024

(30) Foreign Application Priority Data

Sep. 22, 2022    (JP) ................................. 2022-151605

(51) Int. Cl.
H10D 30/66          (2025.01)
H10D 64/27          (2025.01)

(52) U.S. Cl.
CPC ........... H10D 30/66 (2025.01); H10D 64/518 (2025.01)

(58) Field of Classification Search
CPC .............................. H10D 64/518; H10D 30/66
See application file for complete search history.

(56) References Cited

U.S. PATENT DOCUMENTS

2019/0139866 A1     5/2019  Kuraya et al.
2024/0105831 A1*    3/2024  Tsai ........................ H10D 30/66

FOREIGN PATENT DOCUMENTS

JP          H03-53551 A        3/1991
JP          H05-218264 A       8/1993
JP          H10-154783 A       6/1998
                 (Continued)

OTHER PUBLICATIONS

Office Action issued in Japanese Patent Application No. 2022-151605, dated Dec. 9, 2025 in 6 pages.

*Primary Examiner* — Mark V Prenty
(74) *Attorney, Agent, or Firm* — Knobbe, Martens, Olson & Bear, LLP

(57)          ABSTRACT

A semiconductor device includes: a semiconductor chip having a first surface, a second surface, a first electrode provided on the first surface, a second electrode provided on the second surface, and a third electrode provided on the second surface; a first conductor including a fourth conductor and a fifth conductor; a conductive first connector provided between the first conductor and the first electrode; a second conductor including a sixth conductor and a seventh conductor; a conductive second connector provided between the second electrode and the sixth conductor; a third conductor including an eighth conductor, an intermediate conductor, and a ninth conductor, the intermediate conductor being provided between the eighth conductor and the ninth conductor, the eighth conductor being provided between the semiconductor chip and the intermediate conductor, and the intermediate conductor having a through hole; and a conductive third connector.

10 Claims, 9 Drawing Sheets

(56)                   References Cited

FOREIGN PATENT DOCUMENTS

| JP | 2009-164240 A | 7/2009 |
|----|----|----|
| JP | 5565372 B2 | 8/2014 |
| JP | 2018-186184 A | 11/2018 |
| JP | 2019-87657 A | 6/2019 |
| JP | 2019-197842 | 11/2019 |
| JP | 2020-057740 | 4/2020 |

* cited by examiner

Fig.1A A1-A2
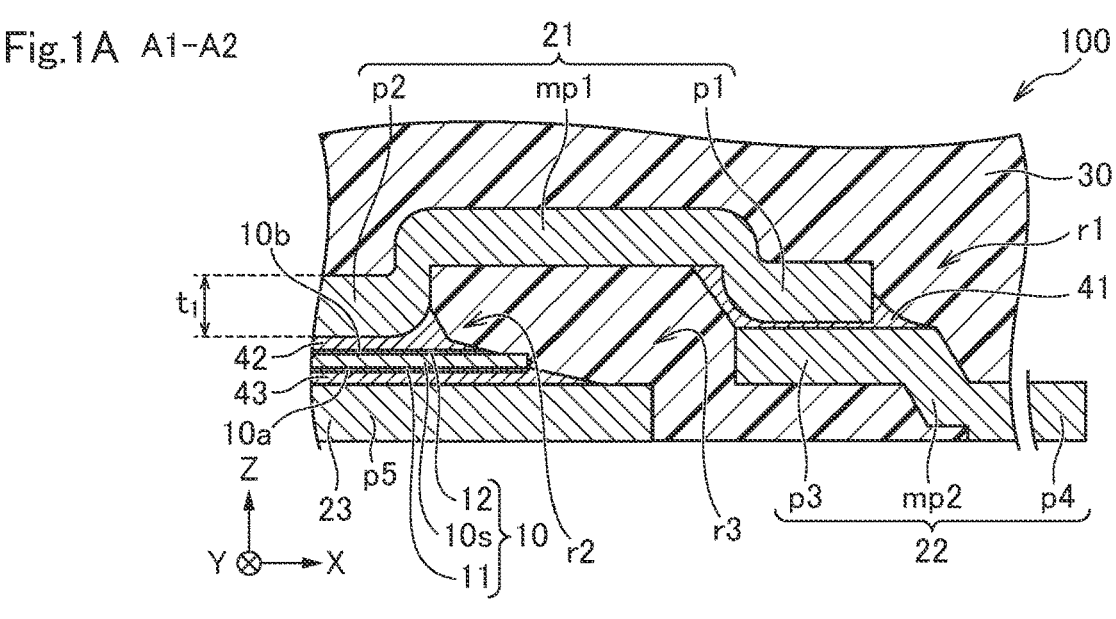
Fig.1B A1-A2
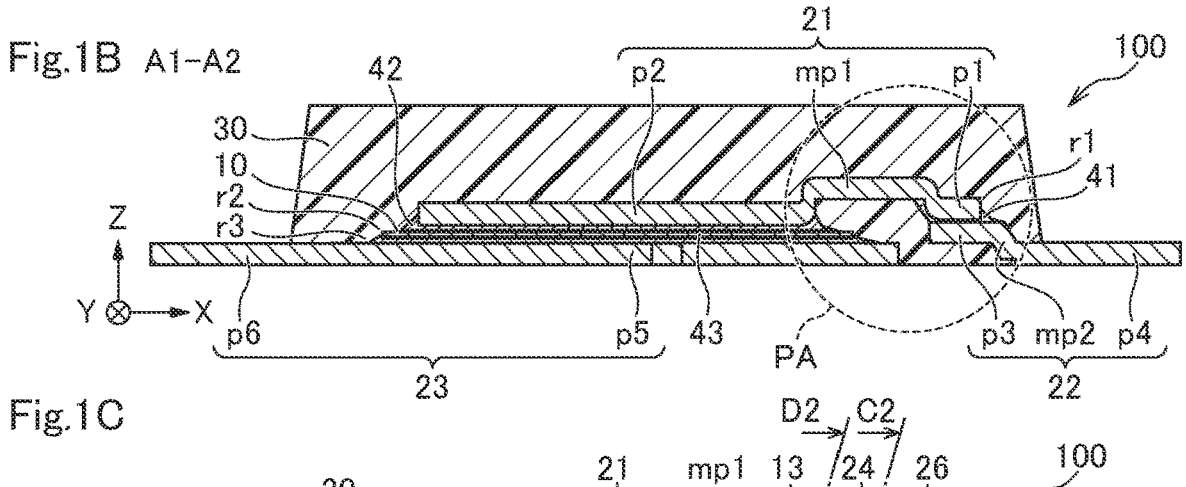
Fig.1C
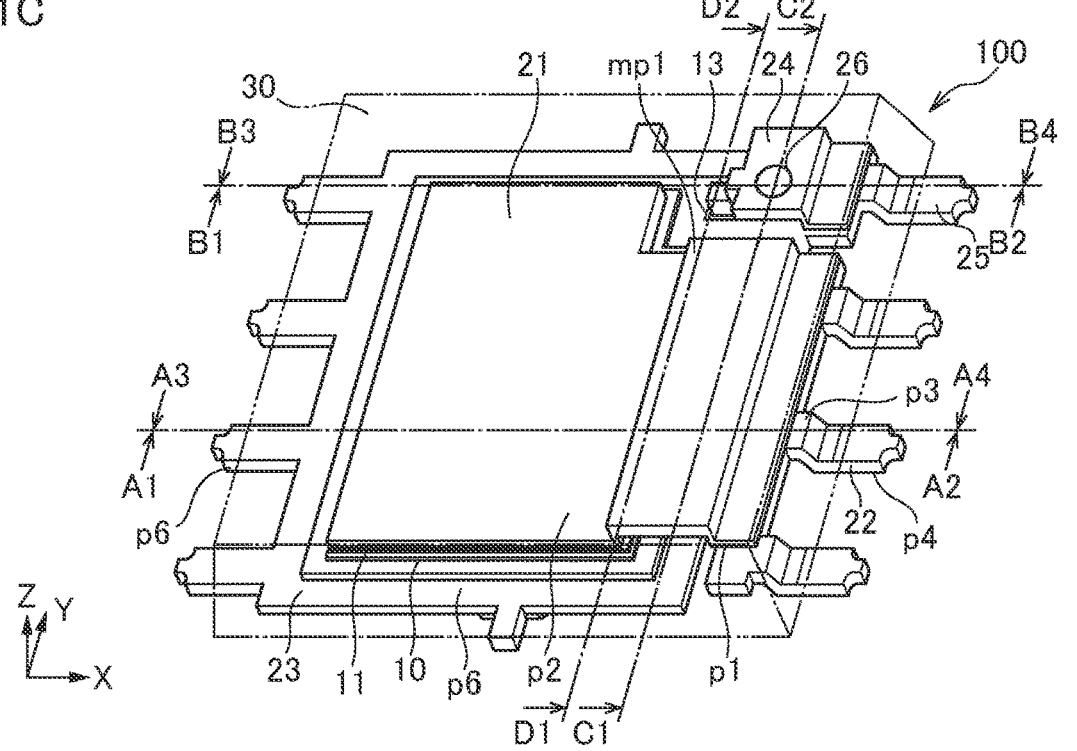

Fig.5A B3-B4
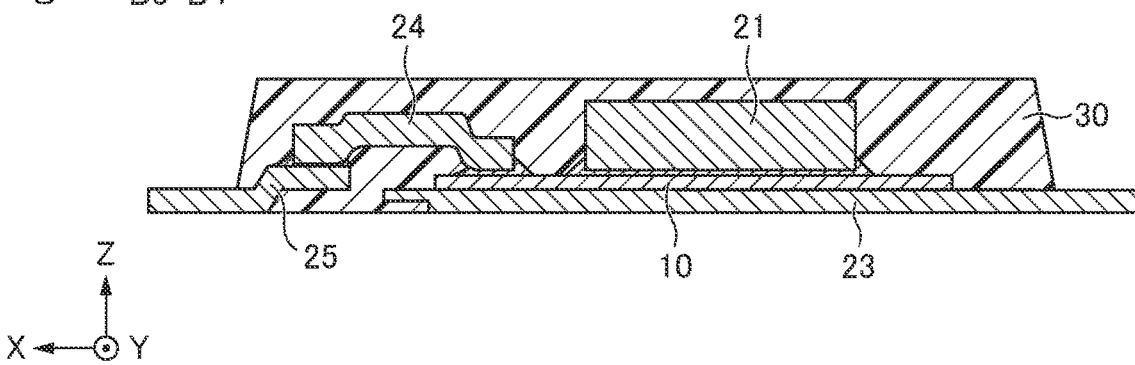
Fig.5B C1-C2
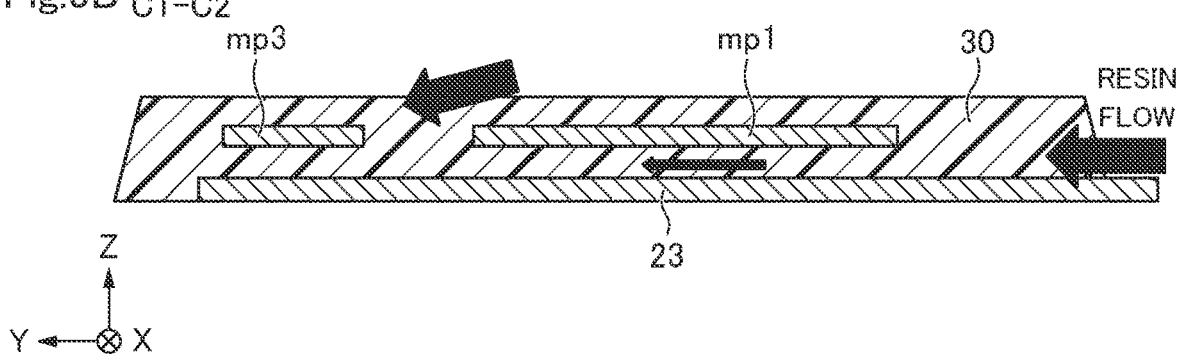
Fig.5C D1-D2
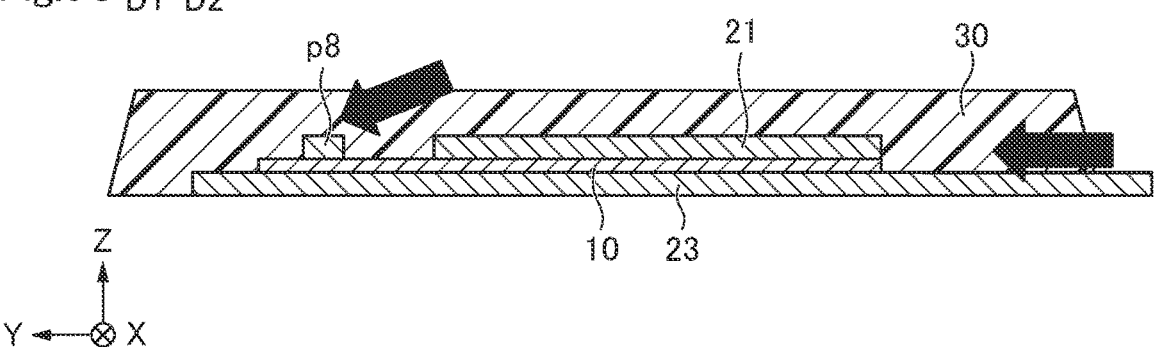
Fig.5D A3-A4
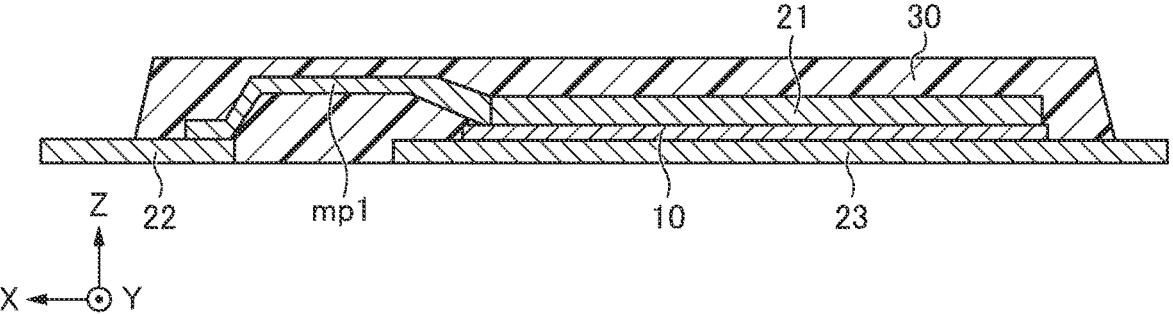

Fig.6A B3-B4
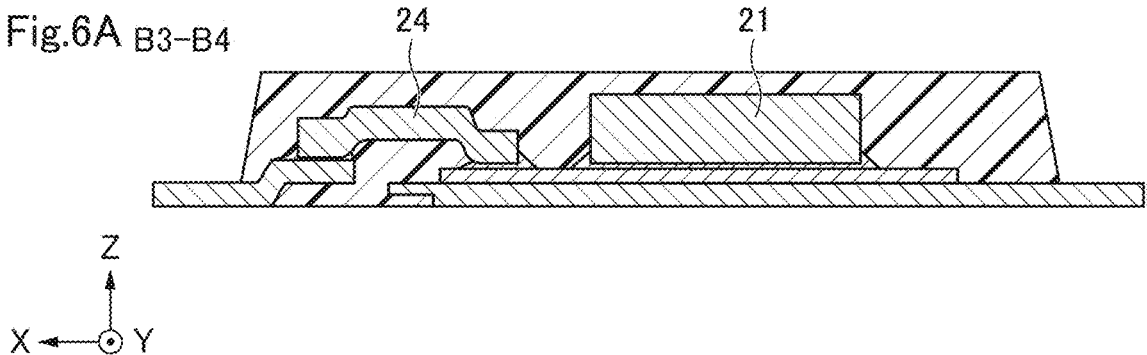
Fig.6B C1-C2
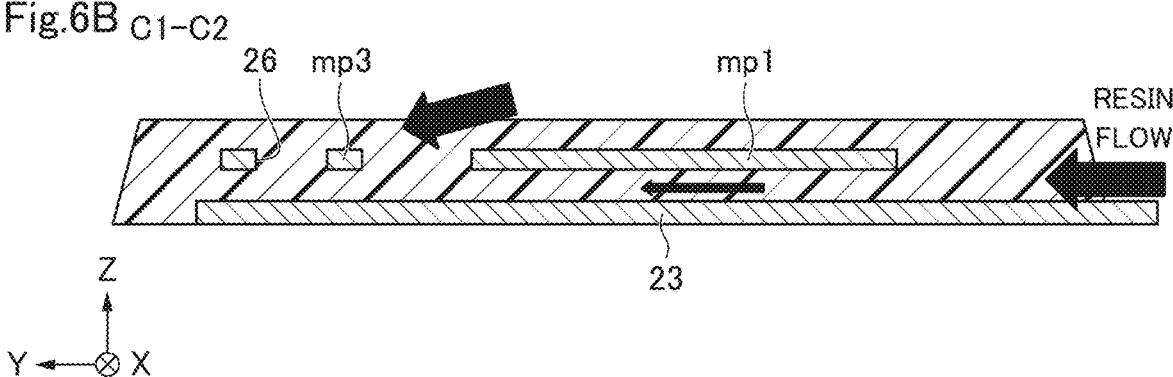
Fig.6C D1-D2
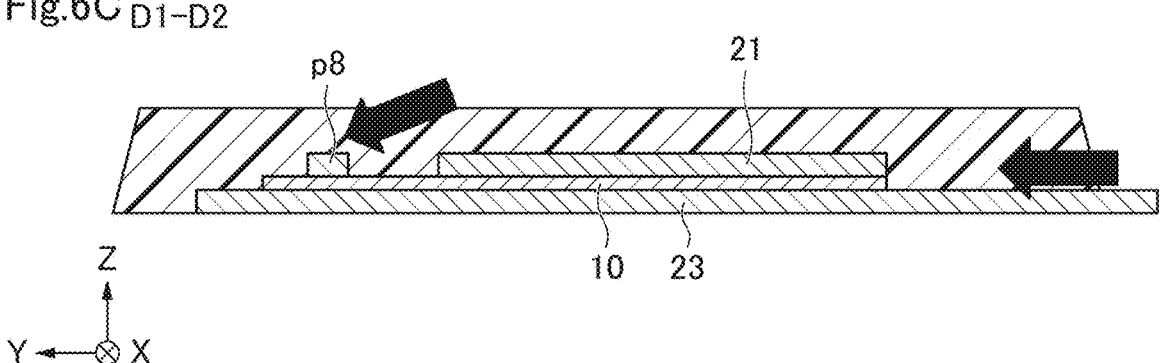
Fig.6D A3-A4
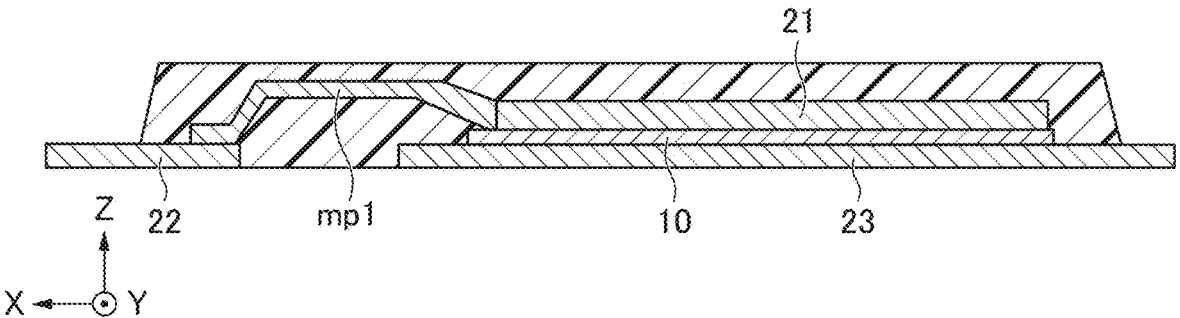

Fig.9A B3–B4
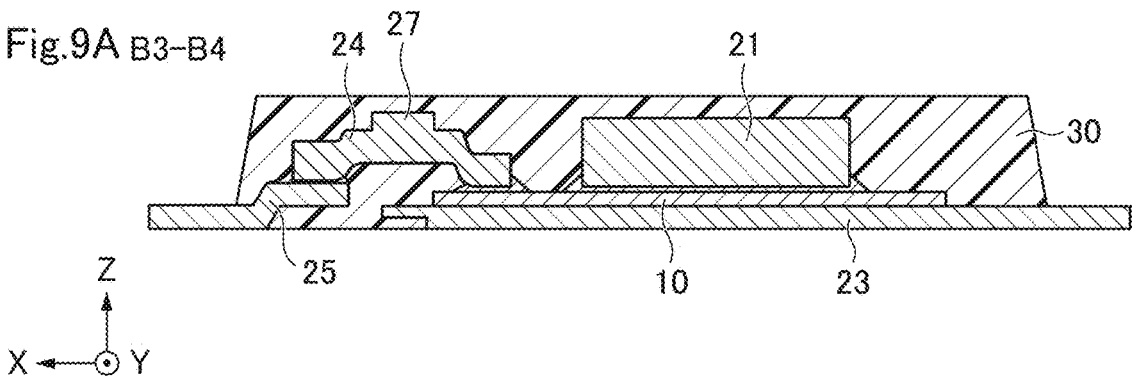
Fig.9B C1–C2
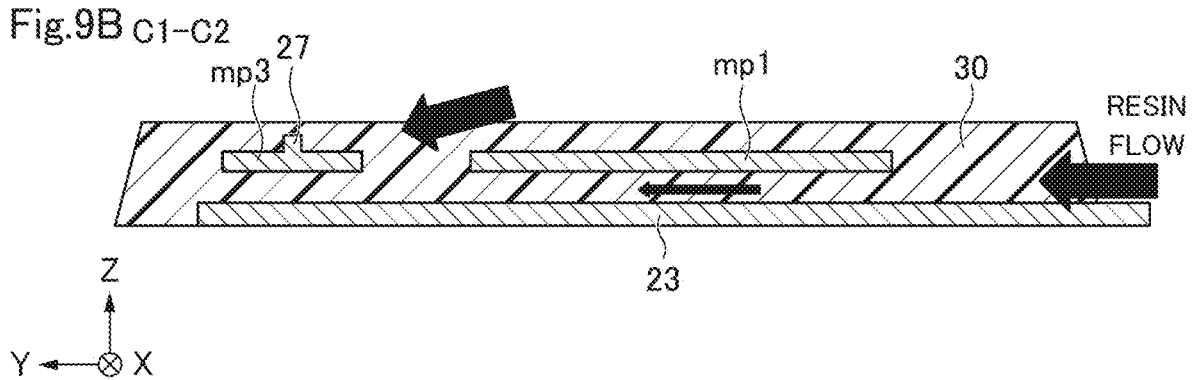
Fig.9C D1–D2
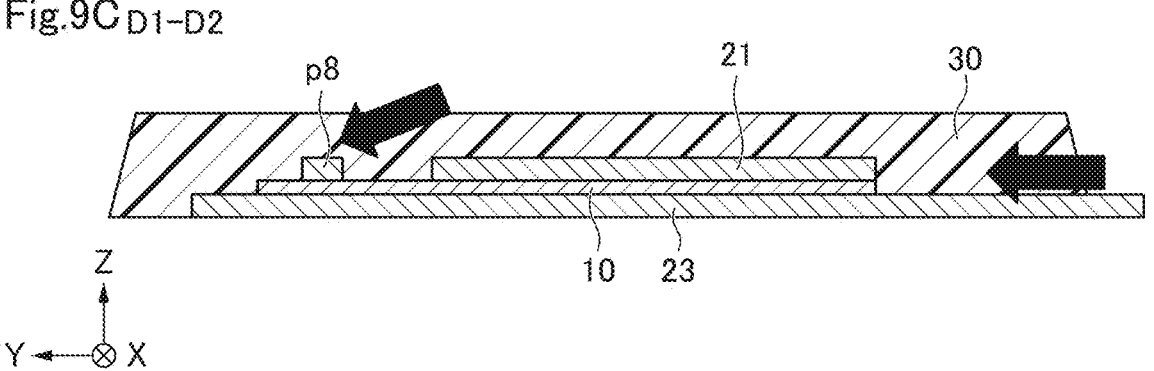
Fig.9D A3–A4
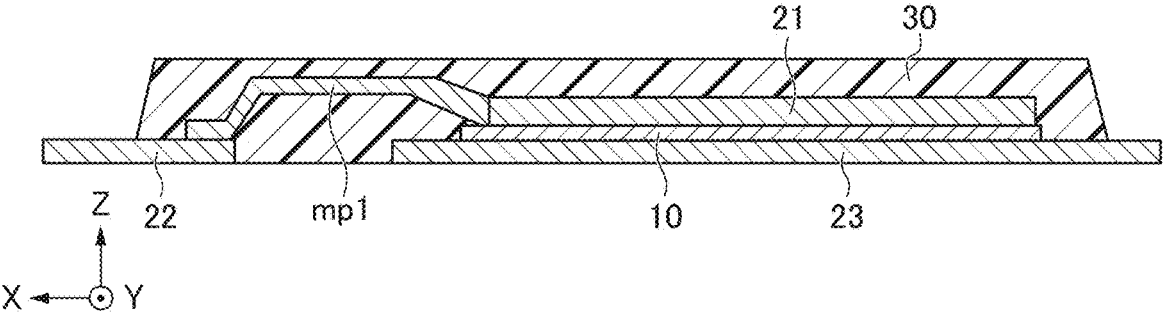

SEMICONDUCTOR DEVICE

CROSS-REFERENCE TO RELATED APPLICATION

This application is based upon and claims the benefit of priority from Japanese Patent Application No. 2022-151605, filed on Sep. 22, 2022, the entire contents of which are incorporated herein by reference.

FIELD

Embodiments described herein relate generally to a semiconductor device.

BACKGROUND

A semiconductor device having a semiconductor chip, such as a metal oxide semiconductor field effect transistor (MOSFET), is used in applications such as power conversion. For example, when the semiconductor device described above is a vertical MOSFET, the source electrode and the gate electrode provided on the top surface of the semiconductor chip are connected to connectors provided on the semiconductor chip.

BRIEF DESCRIPTION OF THE DRAWINGS

FIGS. 1A to 1C are schematic diagrams of a semiconductor device according to a first embodiment;

FIGS. 5A to 5D are schematic cross-sectional views showing a process of manufacturing a semiconductor device that is a comparative form of the first embodiment;

FIGS. 6A to 6D are schematic cross-sectional views showing a process of manufacturing the semiconductor device according to the first embodiment;

FIGS. 9A to 9D are schematic cross-sectional views showing a process of manufacturing the semiconductor device according to the third embodiment.

DETAILED DESCRIPTION

Figure 2:
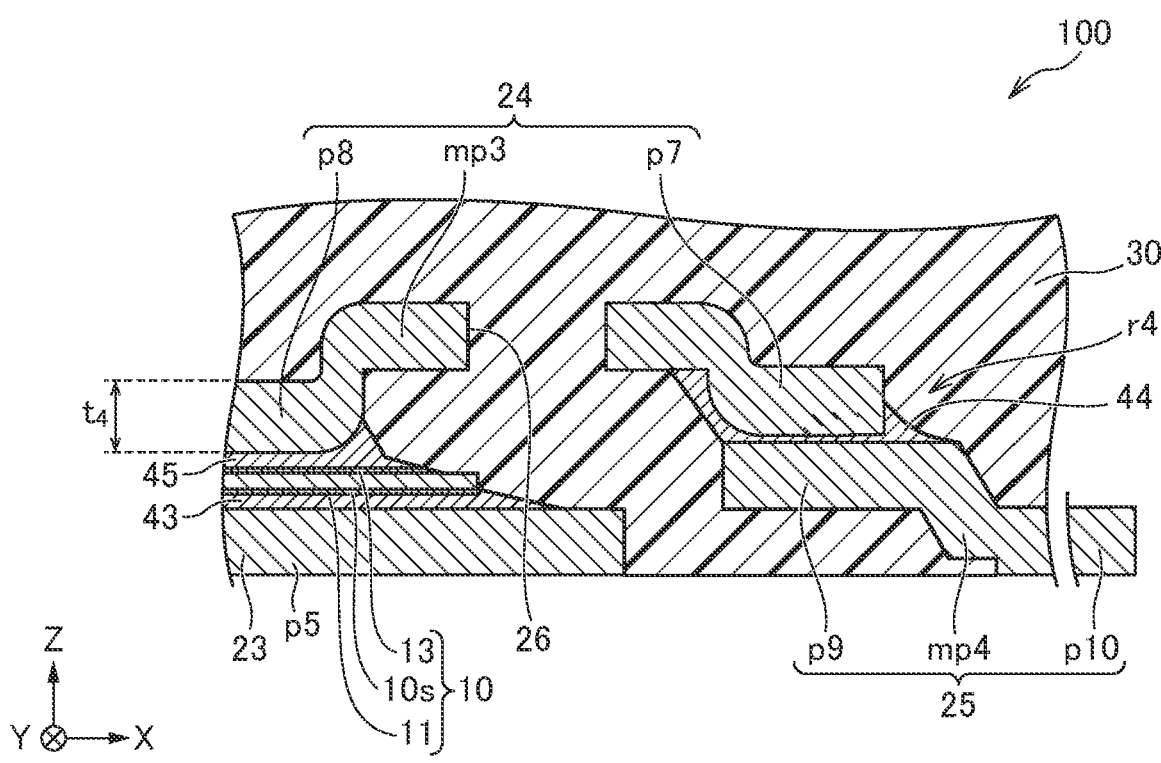
FIG. 2 is a schematic diagram of the semiconductor device according to the first embodiment.

A semiconductor device of embodiments includes: a semiconductor chip having a first surface, a second surface, a first electrode provided on the first surface, a second electrode provided on the second surface, and a third electrode provided on the second surface; a first conductor including a fourth conductor and a fifth conductor, the fourth conductor being electrically connected to the first electrode, a direction from the fourth conductor to the semiconductor chip being along the first direction, and a direction from the fifth conductor to the fourth conductor being along a second direction crossing the first direction; a conductive first connector provided between the first conductor and the first electrode; a second conductor including a sixth conductor and a seventh conductor, a direction from the sixth conductor to the seventh conductor being along a third direction crossing the first direction; a conductive second connector provided between the second electrode and the sixth conductor; a third conductor including an eighth conductor, an intermediate conductor, and a ninth conductor, a direction from the eighth conductor to the ninth conductor being along a fourth direction crossing the first direction, the intermediate conductor being provided between the eighth conductor and the ninth conductor in the fourth direction, the eighth conductor being provided between the semiconductor chip and the intermediate conductor in the first direction, and the intermediate conductor having a through hole; and a conductive third connector provided between the third electrode and the eighth conductor.

Hereinafter, embodiments will be described with reference to the diagrams. In the following description, the same members and the like are denoted by the same reference numerals, and the description of the members and the like once described will be omitted as appropriate.

In this specification, in order to show the positional relationship of components and the like, the upper direction of the diagram is described as "upper" and the lower direction of the diagram is described as "lower". In this specification, the concepts of "upper" and "lower" do not necessarily indicate the relationship with the direction of gravity.

First Embodiment

A semiconductor device of embodiments includes: a semiconductor chip having a first surface, a second surface, a first electrode provided on the first surface, a second electrode provided on the second surface, and a third electrode provided on the second surface; a first conductor including a fourth conductor and a fifth conductor, the fourth conductor being electrically connected to the first electrode, a direction from the fourth conductor to the semiconductor chip being along the first direction, and a direction from the fifth conductor to the fourth conductor being along a second direction crossing the first direction; a conductive first connector provided between the first conductor and the first electrode; a second conductor including a sixth conductor and a seventh conductor, a direction from the sixth conductor to the seventh conductor being along a third direction crossing the first direction; a conductive second connector provided between the second electrode and the sixth conductor; a third conductor including an eighth conductor, an intermediate conductor, and a ninth conductor, a direction from the eighth conductor to the ninth conductor being along a fourth direction crossing the first direction, the intermediate conductor being provided between the eighth conductor and the ninth conductor in the fourth direction, the eighth conductor being provided between the semiconductor chip and the intermediate conductor in the first direction, and the intermediate conductor having a through hole; and a conductive third connector provided between the third electrode and the eighth conductor.

FIGS. 1A to 1C and 2 are schematic diagrams of a semiconductor device 100 of embodiments. FIG. 1C is a schematic perspective view of the semiconductor device 100 of embodiments. FIG. 1B is a schematic cross-sectional view taken along the line A1-A2 of FIG. 1C. FIG. 1A is an enlarged diagram of the schematic cross-sectional view taken along the line A1-A2 of FIG. 1C. FIG. 2 is an enlarged diagram of the schematic cross-sectional view taken along the line B1-B2 of FIG. 1C.

The semiconductor device 100 includes a semiconductor chip 10, a first conductive member 21, a second conductive member 22, a third conductive member 23, a fourth conductive member 24, a fifth conductive member 25, a first connection member 41, a second connection member 42, a third connection member 43, a fourth connection member 44, a fifth connection member 45, and a resin 30.

In addition, a fifth portion p5, a sixth portion p6, and the third conductive member 23 are examples of a fourth conductor, a fifth conductor, and a first conductor, respectively. The third connection member 43 is an example of a first connector. A second portion p2, a first portion p1, and the first conductive member 21 are examples of a sixth conductor, a seventh conductor, and a second conductor, respectively. An eighth portion p8, a third intermediate portion mp3, a seventh portion p7, and the fourth conductive member 24 are examples of an eighth conductor, an intermediate conductor, a ninth conductor, and a third conductor, respectively. The fifth connection member 45 is an example of a third connector.

The semiconductor chip 10 is a chip in which a vertical MOSFET, an insulated gate bipolar transistor (IGBT), and the like are provided on a semiconductor substrate formed of silicon (Si), silicon carbide (SiC), gallium arsenide (GaAs), gallium nitride (GaN), or the like, for example. The semiconductor chip 10 includes a first electrode 11 (for example, a drain electrode), a second electrode 12 (for example, a source electrode), and a semiconductor layer 10s. In this example, the semiconductor layer 10s is provided between the first electrode 11 and the second electrode 12. In addition, the semiconductor chip 10 includes a third electrode 13 (for example, a gate electrode). For example, the semiconductor chip 10 includes a first surface (for example, a bottom surface) 10a and a second surface (for example, a top surface) 10b facing the first surface 10a. The first electrode 11 is provided on the first surface 10a. The second electrode 12 and the third electrode 13 are provided on the second surface 10b.

As shown in FIGS. 1A and 1B, the first conductive member 21 includes the first portion p1 and the second portion p2. In this example, the first conductive member 21 further includes a first intermediate portion mp1.

The second portion p2 is electrically connected to the semiconductor chip 10. In this example, the second portion p2 is electrically connected to the second electrode 12 (for example, a source electrode) (see FIG. 1A).

Here, an X direction (X-axis direction), a Y direction (Y-axis direction) perpendicular to the X direction, and a Z direction (Z-axis direction) perpendicular to the X and Y directions are defined.

The direction from the semiconductor chip 10 to the second portion p2 is along a first direction (Z-axis direction). For example, the second portion p2 is located above the semiconductor chip 10.

The area of the third electrode 13 in the plane perpendicular to the first direction (Z-axis direction) is smaller than the area of the second electrode 12 in the plane perpendicular to the first direction.

The direction from the second portion p2 to the first portion p1 is along a second direction. The second direction crosses the first direction (Z-axis direction).

In this example, the second direction is the X-axis direction. For example, at least a part of the first conductive member 21 extends along the X-axis direction.

The first intermediate portion mp1 is located between the second portion p2 and the first portion p1 in the second direction (X-axis direction). The position of the first intermediate portion mp1 in the second direction is between the position of the second portion p2 in the second direction and the position of the first portion p1 in the second direction. In this example, the first intermediate portion mp1 is located above the second portion p2 and the first portion p1. The first portion p1 and the second portion p2 are provided between the semiconductor chip 10 and the first intermediate portion mp1 in the first direction (Z-axis direction).

The second conductive member 22 includes a third portion p3 and a fourth portion p4. The direction from the third portion p3 to the fourth portion p4 is along a third direction. The third direction crosses the first direction (Z-axis direction). In this example, the third direction is the X-axis direction, and is along the second direction.

As shown in FIG. 1A, the first connection member 41 is provided between the first portion p1 and the third portion p3. The first connection member 41 is conductive. The first connection member 41 contains, for example, solder.

The second electrode 12 (for example, a source electrode) of the semiconductor chip 10 is electrically connected to the second conductive member 22 through the first conductive member 21 and the first connection member 41. The fourth portion p4 of the second conductive member 22 serves as an external terminal connected to the outside.

Thus, the first conductive member 21 electrically connects the semiconductor chip 10 and the second conductive member 22 (an external terminal, a lead terminal) to each other. The first conductive member 21 is, for example, a connector (source connector). On the other hand, the third portion p3 of the second conductive member 22 functions as a post.

The resin 30 covers these members, for example. The resin 30 is, for example, a sealing resin.

As shown in FIGS. 1B and 1C, the resin 30 does not cover the fourth portion p4 of the second conductive member 22. The fourth portion p4 is exposed from the resin 30. Therefore, the fourth portion p4 can be electrically connected to the outside.

On the other hand, as shown in FIG. 1B, the resin 30 is provided above the first conductive member 21. For example, the second portion p2 is located between a part of the resin 30 and the semiconductor chip 10 in the Z-axis direction.

As shown in FIGS. 1A and 1B, the second connection member 42 is located between the semiconductor chip 10 and the second portion p2. The second connection member 42 is conductive. The second connection member 42 contains, for example, solder. The second connection member 42 electrically connects the second electrode of the semiconductor chip 10 and the second portion p2 to each other.

As shown in FIG. 1A, the second conductive member 22 further includes a second intermediate portion mp2 in addition to the third portion p3 and the fourth portion p4. In the third direction (in this example, along the second direction; for example, the X-axis direction), the second intermediate portion mp2 is located between the third portion p3 and the fourth portion p4. In this example, the third portion p3 is located above the fourth portion p4. For example, the position of the second intermediate portion mp2 in the first direction (Z-axis direction) is between the position of the fourth portion p4 in the first direction and each of the position of the first connection member 41 in the first direction and the position of the third portion p3 in the first direction. For example, the third portion p3 is located between a part of the resin 30 and the first connection member 41 in the Z-axis direction.

As shown in FIG. 1B, the third conductive member 23 includes the fifth portion p5 and the sixth portion p6. The fifth portion p5 overlaps the semiconductor chip 10 in the first direction (Z-axis direction). The direction from the fifth portion p5 to the semiconductor chip 10 is along the first direction (Z-axis direction).

The third conductive member 23 is, for example, a bed. The third conductive member 23 may function as a heat dissipation path for heat generated in the semiconductor chip 10.

At least a part of the sixth portion p6 of the third conductive member 23 is not covered with the resin 30. At least a part of the sixth portion p6 is exposed from the resin 30. The sixth portion p6 is another one of the external terminals connected to the outside.

As shown in FIG. 1A, the third connection member 43 is provided between the fifth portion p5 and the semiconductor chip 10. In this example, the third connection member 43 is provided between the fifth portion p5 and the first electrode 11 (for example, a drain electrode). The third connection member 43 is conductive. The third connection member 43 contains, for example, solder. The third connection member 43 electrically connects the fifth portion p5 and the semiconductor chip 10 (for example, the first electrode 11) to each other.

Thus, the first conductive member 21 is electrically connected to the second electrode 12 (for example, a source electrode). The second conductive member 22 is electrically connected to the second electrode 12 through the first conductive member 21. The third conductive member 23 is electrically connected to the first electrode 11 (for example, a drain electrode).

As shown in FIG. 2, the fourth conductive member 24 includes the seventh portion p7 and the eighth portion p8. In this example, the fourth conductive member 24 further includes the third intermediate portion mp3.

The eighth portion p8 is electrically connected to the semiconductor chip 10. In this example, the eighth portion p8 is electrically connected to the third electrode 13 (see FIG. 2).

The direction from the semiconductor chip 10 to the eighth portion p8 is along the first direction (Z-axis direction). For example, the eighth portion p8 is located above the semiconductor chip 10.

The direction from the eighth portion p8 to the seventh portion p7 is along a fourth direction. The fourth direction crosses the first direction (Z-axis direction). In this example, the fourth direction is the X-axis direction. For example, at least a part of the fourth conductive member 24 extends along the X-axis direction.

The third intermediate portion mp3 is located between the eighth portion p8 and the seventh portion p7 in the fourth direction (X-axis direction). The position of the third intermediate portion mp3 in the fourth direction is between the position of the eighth portion p8 in the fourth direction and the position of the seventh portion p7 in the fourth direction. In this example, the third intermediate portion mp3 is located above the eighth portion p8 and the seventh portion p7. The seventh portion p7 and the eighth portion p8 are provided between the semiconductor chip 10 and the third intermediate portion mp3 in the first direction (Z-axis direction).

The third intermediate portion mp3 has a through hole 26 along the Z direction in a direction parallel to the Z direction. A part of the resin 30 is provided inside the through hole 26.

The shape of the through hole 26 in the plane perpendicular to the Z direction is, for example, a circular shape or an elliptical shape. However, the shape of the through hole 26 in the plane parallel to the Z direction is not limited to the circular shape or the elliptical shape.

The fifth conductive member 25 includes a ninth portion p9 and a tenth portion p10. The direction from the ninth portion p9 to the tenth portion p10 is along a fifth direction. The fifth direction crosses the first direction (Z-axis direction). In this example, the fifth direction is the X-axis direction.

As shown in FIG. 2, the fifth conductive member 25 further includes a fourth intermediate portion mp4 in addition to the ninth portion p9 and the tenth portion p10. In the fifth direction, the fourth intermediate portion mp4 is located between the ninth portion p9 and the tenth portion p10. In this example, the ninth portion p9 is located above the tenth portion p10. For example, the position of the fourth intermediate portion mp4 in the first direction (Z-axis direction) is between the position of the tenth portion p10 in the first direction and each of the position of the fourth connection member 44 in the first direction and the position of the ninth portion p9 in the first direction. For example, the ninth portion p9 is located between a part of the resin 30 and the fourth connection member 44 in the Z-axis direction.

As shown in FIG. 2, the fifth connection member 45 is located between the semiconductor chip 10 and the eighth portion p8. The fifth connection member 45 is conductive. The fifth connection member 45 contains, for example, solder. The fifth connection member 45 electrically connects the third electrode 13 of the semiconductor chip and the eighth portion p8 to each other.

As shown in FIG. 2, the fourth connection member 44 is provided between the seventh portion p7 and the ninth portion p9. The fourth connection member 44 electrically connects the seventh portion p7 and the ninth portion p9 to each other. The fourth connection member 44 is conductive. The fourth connection member 44 contains, for example, solder.

The third electrode 13 (for example, a gate electrode) of the semiconductor chip 10 is electrically connected to the fifth conductive member 25 through the fourth conductive member 24 and the fourth connection member 44. The tenth portion p10 of the fifth conductive member 25 serves as an external terminal connected to the outside.

Thus, the fourth conductive member 24 electrically connects the semiconductor chip 10 and the fifth conductive member 25 (external terminal, a lead terminal) to each other. The fourth conductive member 24 is, for example, a connector (gate connector). On the other hand, the tenth portion p10 of the fifth conductive member 25 functions as a post.

Here, the thicknesses of the seventh portion p7, the third intermediate portion mp3, and the eighth portion p8 in the first direction are equal, for example. However, the thicknesses of the seventh portion p7, the third intermediate portion mp3, and the eighth portion p8 in the first direction may be different.

In addition, the thicknesses of the first portion p1, the first intermediate portion mp1, and the second portion p2 in the first direction are equal, for example. However, the thicknesses of the first portion p1, the first intermediate portion mp1, and the second portion p2 in the first direction may be different.

As shown in FIG. 2, the resin 30 does not cover the tenth portion p10 of the fifth conductive member 25. The tenth portion p10 is exposed from the resin 30. Therefore, the tenth portion p10 can be electrically connected to the outside.

A metal such as Cu (copper) is used for the first conductive member 21, the second conductive member 22, the third conductive member 23, the fourth conductive member 24, and the fifth conductive member 25. For the first connection member 41, the second connection member 42, the third connection member 43, the fourth connection member 44, and the fifth connection member 45, for example, solder is used. For the resin 30, for example, an epoxy resin is provided. In addition, the resin 30 may contain a filler containing silicon oxide, for example.

The semiconductor device 100 is, for example, an SOP (small outline package) type semiconductor device.

Figure 3:
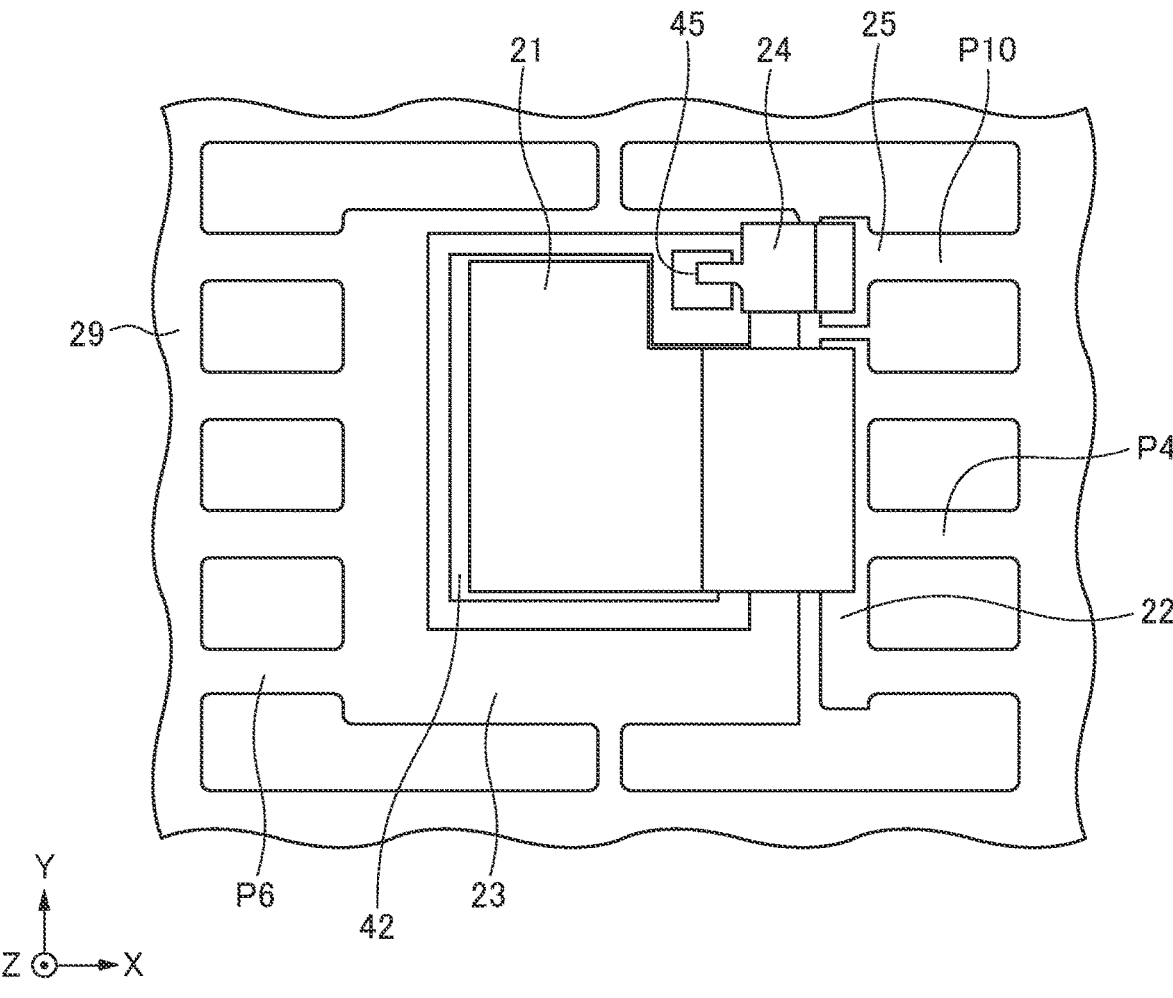
FIG. 3 is a schematic top view showing a process of manufacturing the semiconductor device according to the first embodiment.
Figure 4:
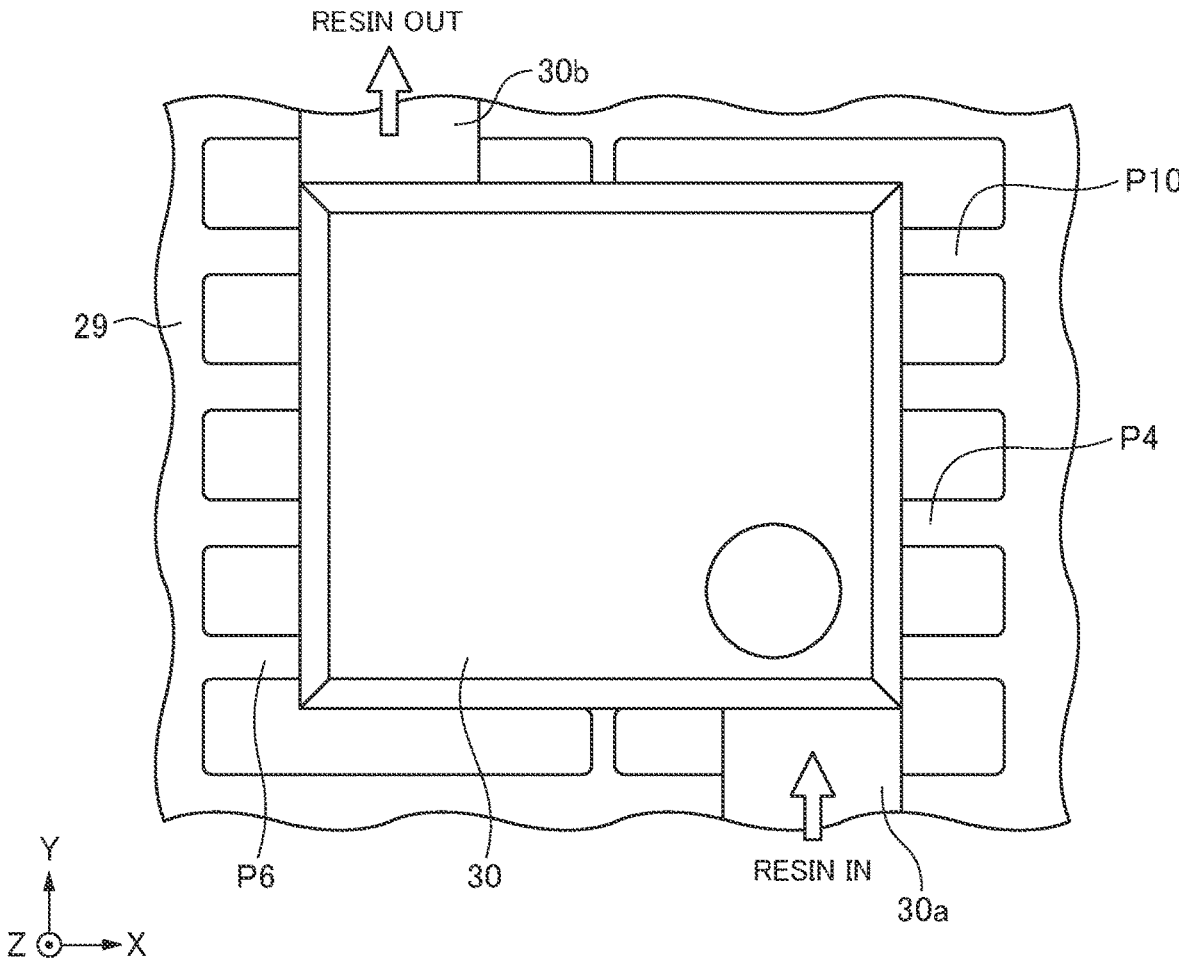
FIG. 4 is a schematic top view showing a process of manufacturing the semiconductor device according to the first embodiment.

FIGS. 3 and 4 are schematic top views showing a process of manufacturing the semiconductor device of embodiments.

The third conductive member 23 is fixed to a suspension lead 29 through the sixth portion p6. The second conductive member 22 is fixed to the suspension lead 29 through the fourth portion p4. The fifth conductive member 25 is fixed to the suspension lead 29 through the tenth portion p10.

For example, by a reflow process, the semiconductor chip 10, the first conductive member 21, the second conductive member 22, the third conductive member 23, the fourth conductive member 24, and the fifth conductive member 25 are fixed by using the first connection member 41, the second connection member 42, the third connection member 43, the fourth connection member 44, and the fifth connection member 45 (FIG. 3).

Then, the semiconductor device in the middle of manufacturing shown in FIG. 3 is clamped by using a resin sealing mold (not shown), so that a part of the fourth portion p4, a part of the sixth portion p6, and a part of the tenth portion p10 are exposed to the outside of the resin sealing mold.

Then, the molten resin 30 is filled inside the resin sealing mold (not shown). As a result, the semiconductor chip 10, the first conductive member 21, the second conductive member 22, the third conductive member 23, the fourth conductive member 24, the fifth conductive member 25, the first connection member 41, the second connection member 42, the third connection member 43, the fourth connection member 44, and the fifth connection member 45 are sealed by using the resin 30. At this time, as shown in FIG. 4, the molten resin 30 is filled from the lower right side toward the upper left side in FIG. 4. A resin portion 30a is formed at the inlet portion of the resin sealing mold. A resin portion 30b is formed at the outlet portion of the resin sealing mold.

Then, cutting between the suspension lead 29 and each of the fourth portion p4, the sixth portion p6, and the tenth portion p10 is appropriately performed. In addition, the resin portion 30a and the resin portion 30b are cut appropriately. As a result, the semiconductor device 100 of embodiments is obtained.

Next, the function and effect of the semiconductor device of embodiments will be described.

FIGS. 5A to 5D are schematic cross-sectional views showing a process of manufacturing a semiconductor device that is a comparative form of embodiments. In FIGS. 5B and 5C, black arrows indicate a direction in which the molten resin 30 flows when the molten resin 30 is filled into the resin sealing mold (not shown).

In addition, in FIGS. 5A to 5D, some of the components are not shown.

FIG. 5A is a schematic cross-sectional view of the semiconductor device of the comparative form corresponding to FIG. 1C taken along the line B3-B4. In addition, the line B3-B4 is a line for viewing the same cross section as the cross section formed by the line B1-B2 from the −Y-axis direction. FIG. 5B is a schematic cross-sectional view of the semiconductor device of the comparative form corresponding to FIG. 1C taken along the line C1-C2. FIG. 5C is a schematic cross-sectional view of the semiconductor device of the comparative form corresponding to FIG. 1C taken along the line D1-D2. FIG. 5D is a schematic cross-sectional view of the semiconductor device of the comparative form corresponding to FIG. 1D taken along the line A3-A4. In addition, the line A3-A4 is a line for viewing the same cross section as the cross section formed by the line A1-A2 from the −Y-axis direction.

A connection failure between the conductive member and the semiconductor chip 10 has been a problem. In particular, a connection failure between the fourth conductive member 24 and the third electrode 13 of the semiconductor chip 10, which is shown in FIG. 2, has been a problem. For example, when solder is used as the fifth connection member 45, there has been a problem that the wettability of the solder with respect to the fourth conductive member 24 and the third electrode 13 is not good. For this reason, a connection failure between the fourth conductive member 24 and the third electrode 13 has occurred.

However, when the above-described sealing using the resin 30 was performed, the connection failure between the fourth conductive member 24 and the third electrode 13 was sometimes covered up by the injection pressure of the molten resin 30 inside the resin sealing mold.

Specifically, as shown in FIG. 5B, the molten resin applies a force to the third intermediate portion mp3 of the fourth conductive member 24 in the Y direction and the −Z direction. As a result, even if a connection failure occurs between the fourth conductive member 24 and the third electrode 13 before sealing using the resin 30, the connection failure may be covered up by the sealing using the resin 30. In addition, there has been a problem that it is difficult to find such a connection failure by pre-shipment inspection.

In addition, specifically, as shown in FIG. 5C, the molten resin 30 applies a force to the eighth portion p8 in the Y direction and the −Z direction. As a result, even if a connection failure occurs between the fourth conductive member 24 and the third electrode 13 before sealing using the resin 30, the connection failure may be covered up by the sealing using the resin 30. In addition, there has been a problem that it is difficult to find such a connection failure by pre-shipment inspection.

Therefore, the third intermediate portion mp3 of the fourth conductive member 24 of the semiconductor device 100 of embodiments includes the through hole 26. In the semiconductor device 100, the through hole 26 is provided along the Z direction.

FIGS. 6A to 6D are schematic cross-sectional views showing a process of manufacturing the semiconductor device of embodiments. In FIGS. 6A to 6D, similarly to FIGS. 5A to 5D, black arrows indicate a direction in which the molten resin 30 flows when the molten resin 30 is filled into the resin sealing mold (not shown).

In addition, in FIGS. 6A to 6D, some of the components are not shown.

FIG. 6A is a schematic cross-sectional view taken along the line B3-B4 of FIG. 1C. In addition, the line B3-B4 is a line for viewing the same cross section as the cross section formed by the line B1-B2 from the −Y-axis direction. FIG. 6B is a schematic cross-sectional view taken along the line C1-C2 of FIG. 1C. FIG. 6C is a schematic cross-sectional view taken along the line D1-D2 of FIG. 1C. FIG. 6D is a schematic cross-sectional view taken along the line A3-A4 of FIG. 1D. In addition, the line A3-A4 is a line for viewing the same cross section as the cross section formed by the line A1-A2 from the −Y-axis direction.

As shown in FIG. 6B, the molten resin 30 applies a force to the third intermediate portion mp3 of the fourth conductive member 24 in the Y direction and the −Z direction. However, since the through hole 26 is provided, a part of the molten resin 30 flows below the third intermediate portion mp3 through the through hole 26. For this reason, the force applied to the third intermediate portion mp3 in the Y direction and the −Z direction becomes weaker. Therefore, the connection failure between the fourth conductive member 24 and the third electrode 13 becomes difficult to be covered up. In addition, as described with reference to FIG. 4, the molten resin 30 is filled from the lower right side to the upper left side in FIG. 4. When the outlet portion of the resin sealing mold is arranged near the fourth conductive member 24 and the fifth conductive member 25, the above-described force applied in the −Z direction increases. For this reason, the above-described connection failure becomes more difficult to be covered up.

In addition, since the through hole 26 is provided, there is an advantage that the lower portion of the third intermediate portion mp3 is quickly filled with the molten resin 30. In this case, even if the above-described force applied in the −Z direction is applied to the third intermediate portion mp3, it becomes difficult for the third intermediate portion mp3 to deform in the −Z direction because the lower portion of the third intermediate portion mp3 is quickly filled. For this reason, the above-described connection failure becomes more difficult to be covered up.

According to the semiconductor device of embodiments, it is possible to provide a highly reliable semiconductor device.

Second Embodiment

A semiconductor device of embodiments is different from the semiconductor device according to the first embodiment in that the shape of the through hole 26 in the plane perpendicular to the first direction is a rectangular shape. Here, the description of the content overlapping the first embodiment will be omitted.

Figure 7:
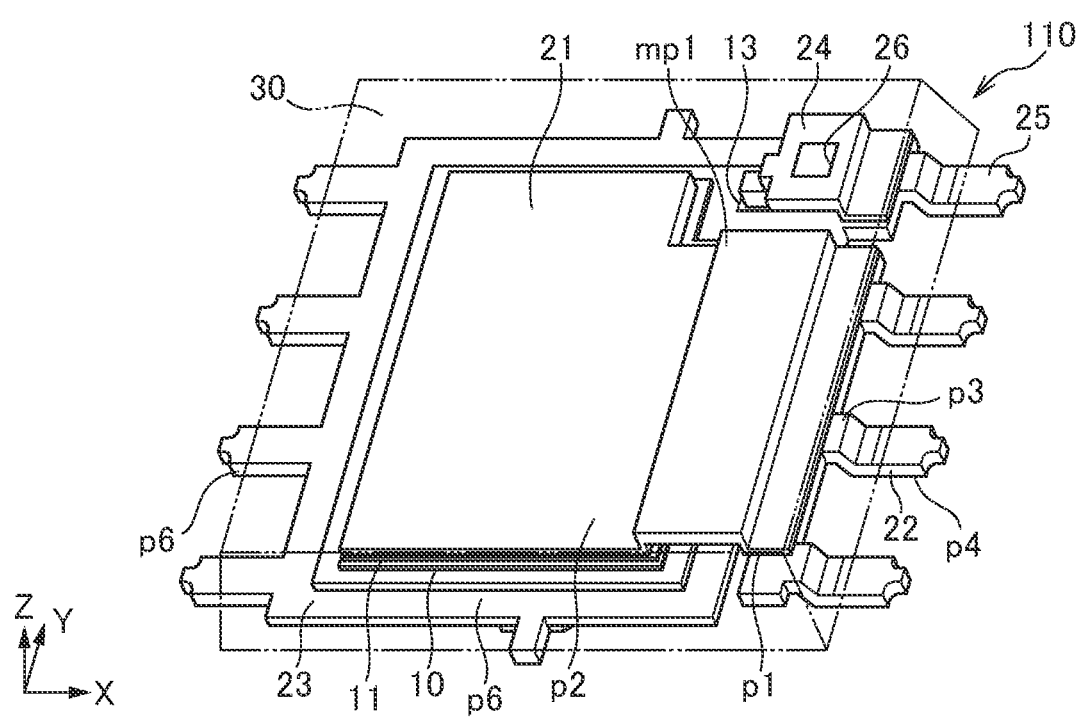
FIG. 7 is a schematic diagram of a semiconductor device according to a second embodiment.

FIG. 7 is a schematic perspective view of a semiconductor device 110 of embodiments.

The shape of the through hole 26 in the plane perpendicular to the Z direction may be a rectangular shape.

According to the semiconductor device of embodiments, it is possible to provide a highly reliable semiconductor device.

Third Embodiment

A semiconductor device of embodiments includes: a semiconductor chip having a first surface, a second surface, a first electrode provided on the first surface, a second electrode provided on the second surface, and a third electrode provided on the second surface; a first conductor including a first portion and a second portion, the first portion being electrically connected to the first electrode, a direction from the first portion to the semiconductor chip being along the first direction, and a direction from the second portion to the first portion being along a second direction crossing the first direction; a conductive first connector provided between the first conductor and the first electrode; a second conductor including a third portion and a fourth portion, a direction from the third portion to the fourth portion being along a third direction crossing the first direction; a conductive second connector provided between the second electrode and the third portion; a third conductor including a fifth portion, an intermediate portion, and a sixth portion, a direction from the fifth portion to the sixth portion being along a fourth direction crossing the first direction, the intermediate portion being provided between the fifth portion and the sixth portion in the fourth direction, and the fifth portion being provided between the semiconductor chip and the intermediate portion in the first direction; a protrusion provided in the intermediate portion, the intermediate portion being provided between the semiconductor chip and the protrusion in the first direction; and a conductive third connector provided between the third electrode and the fifth portion.

The semiconductor device of embodiments is different from the semiconductor devices of the first and second embodiments in that the semiconductor device of embodiments further includes a protrusion provided in the third intermediate portion, the third intermediate portion being provided between the semiconductor chip and the protrusion in the first direction. Here, the description of the content overlapping the first and second embodiments will be omitted.

Figure 8:
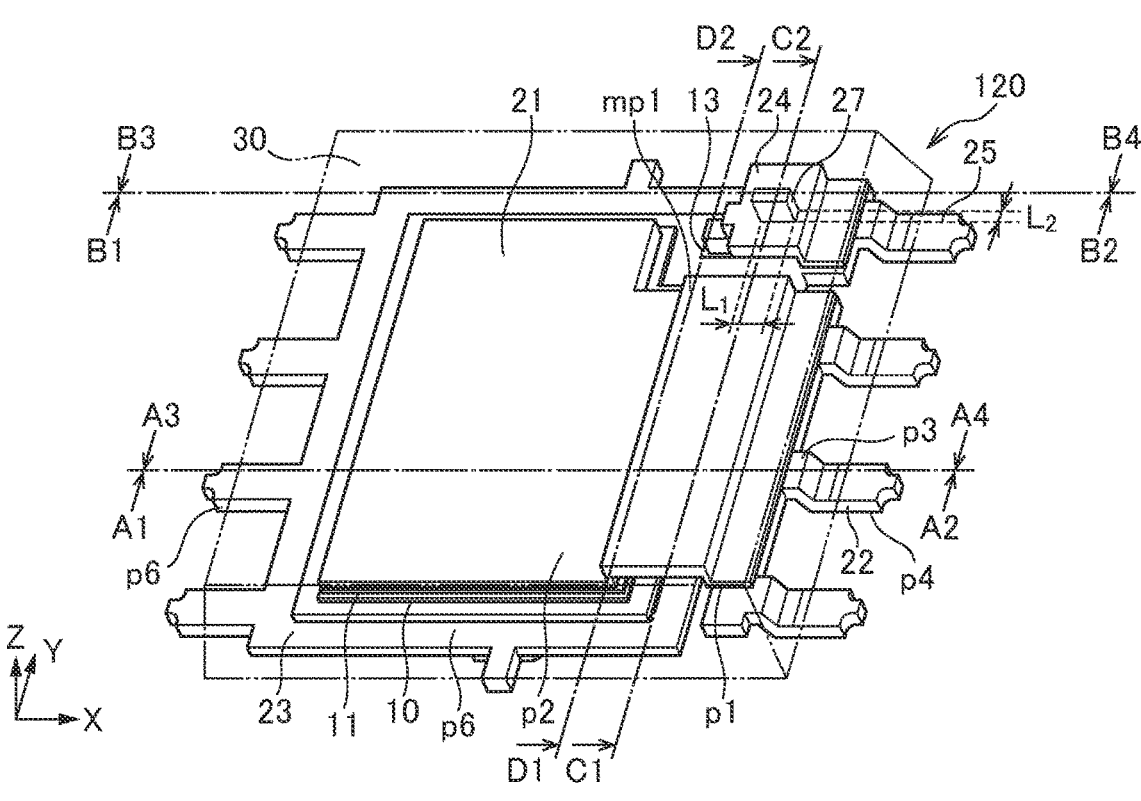
FIG. 8 is a schematic diagram of a semiconductor device according to a third embodiment.

FIG. 8 is a schematic diagram of a semiconductor device 120 of embodiments. FIG. 8 is a schematic perspective view of the semiconductor device 120 of embodiments. FIGS. 9A to 9D are schematic cross-sectional views showing a process of manufacturing the semiconductor device of embodiments.

A protrusion 27 is provided on the third intermediate portion mp3. The third intermediate portion mp3 is provided between the semiconductor chip 10 and the protrusion 27 in the first direction (Z-axis direction).

In FIG. 8, the protrusion 27 has a rectangular parallelepiped shape. However, the shape of the protrusion 27 is not limited to the rectangular parallelepiped shape. For example, the protrusion 27 may have a cylindrical shape whose height direction is parallel to the first direction (Z-axis direction).

It is preferable that the length $L_1$ of the protrusion 27 in the fourth direction (X-axis direction) is larger than the length $L_2$ of the protrusion 27 in the sixth direction crossing the first direction (Z-axis direction) and the fourth direction (X-axis direction). In this example, the sixth direction is the Y-axis direction.

When the resin 30 melted in the manufacturing process flows in the Y direction, the resin 30 collides with the protrusion 27. Then, the resin 30 that has collided with the protrusion 27 flows in the Z direction. For this reason, the force in the −Z direction that is applied to the third intermediate portion mp3 of the fourth conductive member 24 is weakened. Therefore, the connection failure between the fourth conductive member 24 and the third electrode 13 becomes difficult to be covered up.

It is conceivable that when the length $L_1$ of the protrusion 27 in the fourth direction (X-axis direction) is larger than the length $L_2$ of the protrusion 27 in the sixth direction crossing the first direction (Z-axis direction) and the fourth direction (X-axis direction), a larger amount of molten resin 30 flowing parallel to the Y-axis direction can be made to effectively collide with the protrusion 27. For this reason, the amount of resin 30 flowing in the Z direction further increases. As a result, the force in the −Z direction that is applied to the third intermediate portion mp3 of the fourth conductive member 24 is further weakened.

According to the semiconductor device of embodiments, it is possible to provide a highly reliable semiconductor device.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:

a semiconductor chip having a first surface, a second surface, a first electrode provided on the first surface, a second electrode provided on the second surface, and a third electrode provided on the second surface;

a first conductor including a fourth conductor and a fifth conductor, the fourth conductor being electrically connected to the first electrode, a direction from the fourth conductor to the semiconductor chip being along the first direction, and a direction from the fifth conductor to the fourth conductor being along a second direction crossing the first direction;

a conductive first connector provided between the first conductor and the first electrode;

a second conductor including a sixth conductor and a seventh conductor, a direction from the sixth conductor to the seventh conductor being along a third direction crossing the first direction;

a conductive second connector provided between the second electrode and the sixth conductor;

a third conductor including an eighth conductor, an intermediate conductor, and a ninth conductor, a direction from the eighth conductor to the ninth conductor being along a fourth direction crossing the first direction, the intermediate conductor being provided between the eighth conductor and the ninth conductor in the fourth direction, the eighth conductor being provided between the semiconductor chip and the intermediate conductor in the first direction, and the intermediate conductor having a through hole; and a conductive third connector provided between the third electrode and the eighth conductor.

2. The semiconductor device according to claim 1, wherein the through hole extends in the first direction.

3. The semiconductor device according to claim 1, wherein a shape of the through hole in a plane perpendicular to the first direction is a circular shape or an elliptical shape.

4. The semiconductor device according to claim 1, wherein a shape of the through hole in a plane perpendicular to the first direction is a rectangular shape.

5. The semiconductor device according to claim 1, wherein an area of the third electrode in a plane perpendicular to the first direction is smaller than an area of the second electrode in the plane perpendicular to the first direction.

6. A semiconductor device, comprising:

a semiconductor chip having a first surface, a second surface, a first electrode provided on the first surface, a second electrode provided on the second surface, and a third electrode provided on the second surface;

a first conductor including a fourth conductor and a fifth conductor, the fourth conductor being electrically connected to the first electrode, a direction from the fourth conductor to the semiconductor chip being along the first direction, and a direction from the fifth conductor to the fourth conductor being along a second direction crossing the first direction;

a conductive first connector provided between the first conductor and the first electrode;

a second conductor including a sixth conductor and a seventh conductor, a direction from the sixth conductor to the seventh conductor being along a third direction crossing the first direction;

a conductive second connector provided between the second electrode and the sixth conductor;

a third conductor including an eighth conductor, an intermediate conductor, and a ninth conductor, a direction from the eighth conductor to the ninth conductor being along a fourth direction crossing the first direction, the intermediate conductor being provided between the eighth conductor and the ninth conductor in the fourth direction, and the eighth conductor being provided between the semiconductor chip and the intermediate conductor in the first direction;

a protrusion provided in the intermediate conductor, the intermediate conductor being provided between the semiconductor chip and the protrusion in the first direction; and a conductive third connector provided between the third electrode and the eighth conductor.

7. The semiconductor device according to claim 6, wherein a length of the protrusion in the fourth direction is larger than a length of the protrusion in a sixth direction crossing the first direction and the fourth direction.

8. The semiconductor device according to claim 6, wherein an area of the third electrode in a plane perpendicular to the first direction is smaller than an area of the second electrode in the plane perpendicular to the first direction.

9. The semiconductor device according to claim 6, wherein the protrusion has a rectangular parallelepiped shape.

10. The semiconductor device according to claim 6, wherein the protrusion has a cylindrical shape whose height direction is parallel to the first direction.

* * * * *